(12) United States Patent
Tien et al.

(10) Patent No.: US 11,569,096 B2
(45) Date of Patent: Jan. 31, 2023

(54) SEMICONDUCTOR DEVICE

(71) Applicant: TAIWAN SEMICONDUCTOR MANUFACTURING CO., LTD., Hsinchu (TW)

(72) Inventors: Hsi-Wen Tien, Hsinchu County (TW); Wei-Hao Liao, Taichung (TW); Chih-Wei Lu, Hsinchu (TW); Pin-Ren Dai, Hsinchu County (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 70 days.

(21) Appl. No.: 17/327,580

(22) Filed: May 21, 2021

(65) Prior Publication Data
US 2021/0280434 A1   Sep. 9, 2021

Related U.S. Application Data

(60) Continuation of application No. 16/988,609, filed on Aug. 8, 2020, now Pat. No. 11,018,027, which is a
(Continued)

(51) Int. Cl.
*H01L 21/48*   (2006.01)
*H01L 23/532*   (2006.01)
(Continued)

(52) U.S. Cl.
CPC ........ *H01L 21/486* (2013.01); *H01L 23/5226* (2013.01); *H01L 23/5283* (2013.01);
(Continued)

(58) Field of Classification Search
CPC ......... H01L 21/76897; H01L 23/53238; H01L 21/486; H01L 21/76852; H01L 23/5226;
(Continued)

(56) References Cited

U.S. PATENT DOCUMENTS

2008/0023740 A1   1/2008   Horng
2008/0303074 A1*  12/2008  Noda ...................... H01L 28/57
                                                          257/295
(Continued)

*Primary Examiner* — Mouloucoulaye Inoussa
(74) *Attorney, Agent, or Firm* — Maschoff Brennan

(57) ABSTRACT

An semiconductor device includes a first dielectric layer, an etch stop layer, an interconnect structure, and a second dielectric layer. The etch stop layer is over the first dielectric layer. The interconnect structure includes a conductive via in the first dielectric layer and the etch stop layer, a conductive line over the conductive via, an intermediate conductive layer over the conductive line, and a conductive pillar over the intermediate conductive layer. The interconnect structure is electrically conductive at least from a top of the conductive pillar to a bottom of the conductive via. The second dielectric layer surrounds the conductive line, the intermediate conductive layer, and the conductive pillar, wherein a bottom of the second dielectric layer is lower than a top of the conductive line, and a top of the second dielectric layer is higher than the top of the conductive line.

20 Claims, 11 Drawing Sheets

Related U.S. Application Data division of application No. 15/828,077, filed on Nov. 30, 2017, now Pat. No. 10,741,417.

(51) Int. Cl.
  *H01L 23/522* (2006.01)
  *H01L 23/528* (2006.01)

(52) U.S. Cl.
  CPC ............ *H01L 23/53238* (2013.01); *H01L 2924/01013* (2013.01); *H01L 2924/01029* (2013.01); *H01L 2924/14* (2013.01)

(58) Field of Classification Search
  CPC ........... H01L 23/5283; H01L 21/76885; H01L 43/02; H01L 43/08; H01L 27/228; H01L 43/12; H01L 45/1253; H01L 45/146; H01L 45/08; H01L 45/1233; H01L 27/2436; H01L 45/1675; H01L 28/55; H01L 21/02274; H01L 28/60; H01L 21/32; H01L 21/02266; H01L 27/11507; H01L 21/76849; H01L 21/7687; H01L 28/82; H01L 28/57; H01L 21/02164; H01L 21/0217; H01L 21/02271; H01L 21/02178; H01L 27/11504; H01L 27/222; H01L 27/2427; H01L 45/085; H01L 45/16; H01L 27/2481; H01L 45/1266; H01L 45/1273; H01L 27/24; H01L 21/76877; H01L 21/76883; H01L 24/89; H01L 21/3212; H01L 24/80; H01L 21/7684; H01L 21/76871; H01L 21/76843; H01L 25/50; H01L 21/76807; H01L 23/528; H01L 21/31111; H01L 25/0657; H01L 21/0214; G11C 13/0097; G11C 13/0038; G11C 13/0069; G11C 13/003
  USPC ............... 257/295, 421, E27.104, E21.585, 257/E21.664, E43.001, E43.006; 438/675, 3
  See application file for complete search history.

(56) References Cited

U.S. PATENT DOCUMENTS

| | | | |
|---|---|---|---|
| 2011/0121417 A1* | 5/2011 | Li | H01L 43/08 716/101 |
| 2013/0119494 A1* | 5/2013 | Li | H01L 43/08 257/E43.001 |
| 2014/0176132 A1 | 6/2014 | Chen | |
| 2015/0171314 A1* | 6/2015 | Li | H01L 43/02 257/421 |
| 2015/0263267 A1* | 9/2015 | Kanaya | H01L 43/12 257/421 |
| 2016/0027843 A1* | 1/2016 | Kumura | H01L 43/08 257/295 |
| 2016/0190432 A1* | 6/2016 | Shum | H01L 27/222 257/427 |
| 2016/0247810 A1* | 8/2016 | Nakao | H01L 28/55 |
| 2016/0268505 A1* | 9/2016 | Sung | H01L 45/1253 |
| 2017/0025381 A1* | 1/2017 | Tsai | H01L 21/76877 |
| 2017/0117467 A1* | 4/2017 | Chang | H01L 45/1683 |
| 2017/0301728 A1* | 10/2017 | Chuang | H01L 43/02 |
| 2018/0012657 A1* | 1/2018 | Shih | H01L 45/08 |
| 2018/0097175 A1* | 4/2018 | Chuang | H01L 43/02 |

\* cited by examiner

SEMICONDUCTOR DEVICE

PRIORITY CLAIM AND CROSS-REFERENCE

This present application is a continuation application of U.S. patent application Ser. No. 16/988,609, filed Aug. 8, 2020, now U.S. Pat. No. 11,018,027, issued May 25, 2021, which is a divisional application of U.S. patent application Ser. No. 15/828,077, filed on Nov. 30, 2017, now U.S. Pat. No. 10,741,417, issued on Aug. 11, 2020, all of which are herein incorporated by reference in their entirety.

BACKGROUND

Semiconductor devices are used in a variety of electronic applications, such as personal computers, cell phones, digital cameras, and other electronic equipment. The semiconductor devices are typically fabricated by sequentially depositing insulating or dielectric layers, conductive layers, and semiconductor layers over a semiconductor substrate, and patterning the various material layers using lithography and etching to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As device scaling-down continues, conventional processes for manufacturing interconnect structures have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
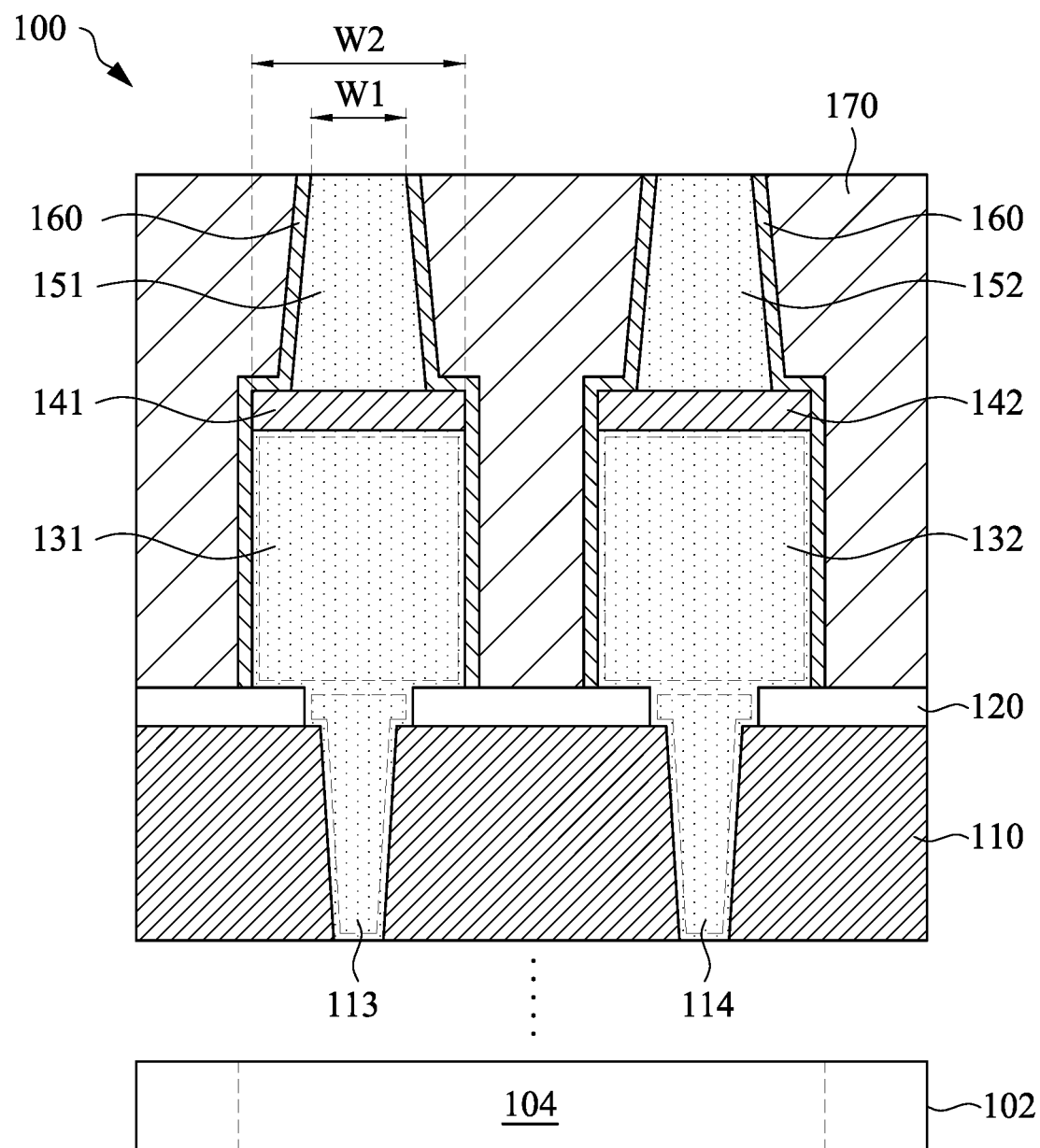
FIG. 1 is a schematic cross-sectional view of an interconnect structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the continued scaling down of semiconductor devices, feature sizes of back-end-of-the-line (BEOL) metal interconnects have also decreased. The decreased feature sizes of BEOL metal interconnects have resulted in larger aspect ratios for the gaps such as trenches and vias, which are filled with conductive layers during the formation of the metal interconnects. The larger aspect ratios of vias and trenches in dual damascene metallization processes have been difficult for electrochemical plating (ECP) processes to fill, resulting in the formation of voids, or areas in which the conductive material is not formed, in the via trenches. Since voids do not have conductive material, they can result in bad connections and hurt reliability.

Accordingly, methods for forming an interconnect structure are provided. In the methods, three metal layers are first formed, and then one or more etch operations are performed to etch the three metal layers, so as to form metal pillars. Therefore, no voids will be generated.

FIG. 1 is a schematic cross-sectional view of an interconnect structure in accordance with some embodiments. Referring to FIG. 1, an interconnect structure 100 is disposed over a substrate 102. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, the substrate 102 includes a device region 104. The device region 104 may have various device elements. Examples of the device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

Other components or layers such as interlayer dielectric (ILD) layers, conductive features, and isolation structure, may be disposed between the substrate 102 and a dielectric layer 110. In some embodiments, the dielectric layer 110 is an interlayer dielectric layer or an intermetal dielectric layer. The dielectric layer 110 may include multilayers made of multiple dielectric materials, such as a low dielectric constant or an extreme low dielectric constant (ELK) material. In some embodiments, the dielectric layer 110 is made of low-k dielectric materials. In some embodiments, the dielectric layer 110 is made of silicon oxide, silicon nitride, silicon oxynitride, phosphosilicate glass (PSG), borophosphosilicate glass (BPSG), and/or other applicable low-k dielectric materials. In some embodiments, the dielectric layer 110 has a thickness in a range substantially from 200 Å to 350 Å.

An etch stop layer 120 is disposed over the dielectric layer 110. Conductive vias 113 and 114 are disposed in the etch stop layer 120 and the dielectric layer 110. The conductive vias 113 and 114 may include copper (Cu), cobalt (Co), ruthenium (Ru), aluminum (Al), molybdenum (Mo), Tungsten (W), CoW, cobalt tungsten phosphorous (CoWP), and/or other applicable materials. In some embodiments, the etch stop layer 106 is made of silicon nitride, silicon oxynitride, and/or other applicable materials. In some embodiments, the etch stop layer 120 has a thickness in a range substantially from 50 Å to 70 Å.

Metal line 131 and 132 are disposed on the etch stop layer 120. The metal line 131 and 132 are in contact with the conductive vias 113 and 114 respectively. In some embodiments, the metal line 131 and the conductive vias 113 may be a continuous, seamless body of material, and the metal line 132 and the conductive vias 114 may be a continuous, seamless body of material. In some embodiments, the material of the metal line 131 and 132 includes Al, Cu, Co, W, ruthenium (Ru), or zirconium (Zr). In some embodiments, the thickness of the metal line 131 and 132 is in a range substantially from 20 Å to 700 Å.

Intermediate metal layers 141 and 142 are disposed on the metal lines 131 and 132 respectively. In some embodiments, the sidewalls of the intermediate metal layer 141 are vertically aligned with the sidewalls of the metal line 131. Similarly, the sidewalls of the intermediate metal layer 142 are vertically aligned with the sidewalls of the metal line 132. In some embodiments, the material of the intermediate metal layers 141 and 142 includes tantalum (Ta), tantalm nitride (TaN), titanium nitride (TiN), Cu, Co, W, Ru, Zr or graphene. In some embodiments, the thickness of the intermediate metal layers 141 and 142 is in a range substantially from 5 Å to 200 Å.

Metal pillars 151 and 152 are disposed on the intermediate metal layers 141 and 142 respectively. The metal pillar 151 has a width W1. The metal line 131 and the intermediate metal layer 141 have the same width W2 which is greater than the width W1. From another aspect, the metal pillar 151 is in contact only a portion of the intermediate metal layer 141. Similarly, the width of the metal pillar 152 is less than the width of the metal line 132 and the width of the intermediate metal layer 142. In other words, the metal pillar 152 is in contact only a portion of the intermediate metal layer 142. In some embodiments, the material of the metal pillars 151 and 152 includes Al, Cu, Co, W, Ru, or Zr. In some embodiments, the thickness of the metal pillar 151 and 152 is in a range substantially from 50 Å to 1000 Å.

In some embodiments, the material of the metal lines 131 and 132 is different from that of the intermediate metal layers 141 and 142. In addition, the material of the intermediate metal layers 141 and 142 is different from that of the metal pillars 151 and 152. For example, the material of the metal lines 131 and 132 may include Ru or one of Cu and Co, and the material of the metal pillars 151 and 152 may include the other one of Cu and Co. The material of the intermediate metal layers 141 and 142 may include Ta, TaN or TiN. In some embodiments, the material of the metal lines 131 and 132 is identical to that of the metal pillars 151 and 152. In some embodiments, the material of the metal lines 131 and 132 is different from that of the metal pillars 151 and 152.

The interconnect structure 100 also includes a cap layer 160 that lines the sidewalls of the metal pillars 151 and 152. The cap layer 160 also lines a portion of top surfaces of the intermediate metal layers 141 and 142, and the sidewalls of the intermediate metal layers 141 and 142. The cap layer 160 also lines the sidewalls of the metal lines 131 and 132. The material of the cap layer 160 includes Ta, TaN, TiN, Co, Ru, Zr, or graphene. In some embodiments, the material of the cap layer 160 is identical to that of the intermediate metal layers 141 and 142. In some embodiments, the thickness of the cap layer 160 is in a range substantially from 10 Å to 100 Å.

A dielectric layer 170 is disposed laterally around the metal pillars 151, 152, the metal lines 131, 132, and the intermediate metal layers 141 and 142. In some embodiments, the dielectric layer 170 is made of silicon oxide, silicon nitride, silicon oxynitride, phosphosilicate glass (PSG), borophosphosilicate glass (BPSG), and/or other applicable low-k dielectric materials. In some embodiments, the dielectric layer 170 is coplanar with the metal pillars 151 and 152, and additional conductive features (not shown) may be in contact with the metal pillars 151 and 152. Alternatively, the dielectric layer 170 may cover the metal pillars 151 and 152, and has openings to expose the metal pillars 151 and 152.

Figure 2A:
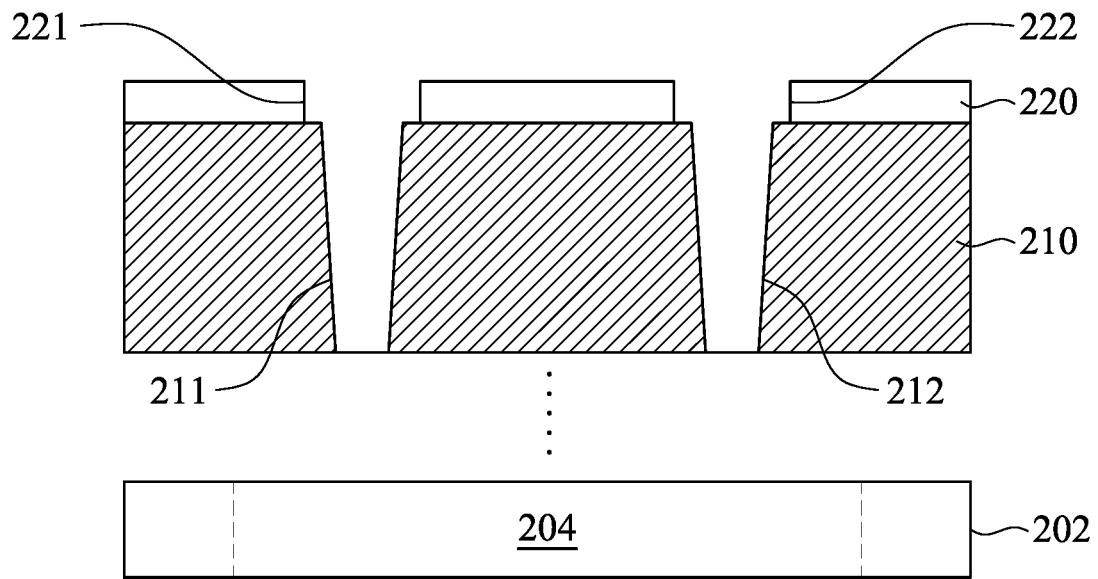
FIG. 2A to FIG. 2K are schematic cross-sectional views of intermediate stages showing a method for manufacturing an interconnect structure in accordance with some embodiments.

FIG. 2A to FIG. 2K are schematic cross-sectional views of intermediate stages showing a method for manufacturing an interconnect structure in accordance with some embodiments. Referring to FIG. 2A, a substrate 202 is provided. The substrate 202 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, the substrate 202 includes a device region 204. The device region 204 may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

A dielectric layer 210 is formed over the substrate 202. Other components or layers such as interlayer dielectric (ILD) layers, conductive features, and isolation structure, may be disposed between the substrate 202 and the dielectric layer 210. In some embodiments, the dielectric layer 210 is an interlayer dielectric layer or an intermetal dielectric layer. The dielectric layer 210 may include multilayers made of multiple dielectric materials, such as a low dielectric constant or an extreme low dielectric constant (ELK) material. In some embodiments, the dielectric layer 210 is made of low-k dielectric materials. In some embodiments, the dielectric layer 210 is made of silicon oxide, silicon nitride, silicon oxynitride, phosphosilicate glass (PSG), borophosphosilicate glass (BPSG), and/or other applicable low-k dielectric materials. In some embodiments, the dielectric layer 210 has a thickness in a range substantially from 200 Å to 350 Å.

An etch stop layer 220 is formed over the dielectric layer 210. In some embodiments, the etch stop layer 220 is made of silicon nitride, silicon oxynitride, and/or other applicable materials. In some embodiments, the etch stop layer 220 has a thickness in a range substantially from 50 Å to 70 Å.

In some embodiments, the dielectric 210 and the etch stop layer 220 are formed by performing a plasma enhanced chemical vapor deposition (CVD) process, a low pressure CVD process, an atomic layer deposition (ALD) process, or other applicable processes. One or more etch operations are performed to form openings 211 and 212 in the dielectric layer 210, and openings 221 and 222 in the etch stop layer 220. Any applicable wet etch or dry etch operation may be adopted.

Figure 2B:
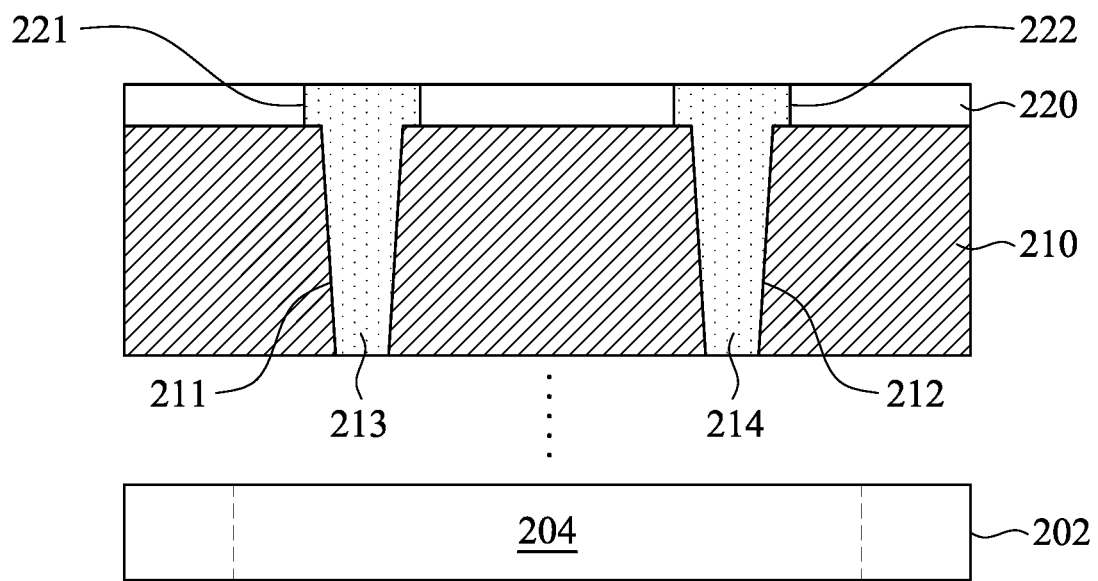
Figure 2C:
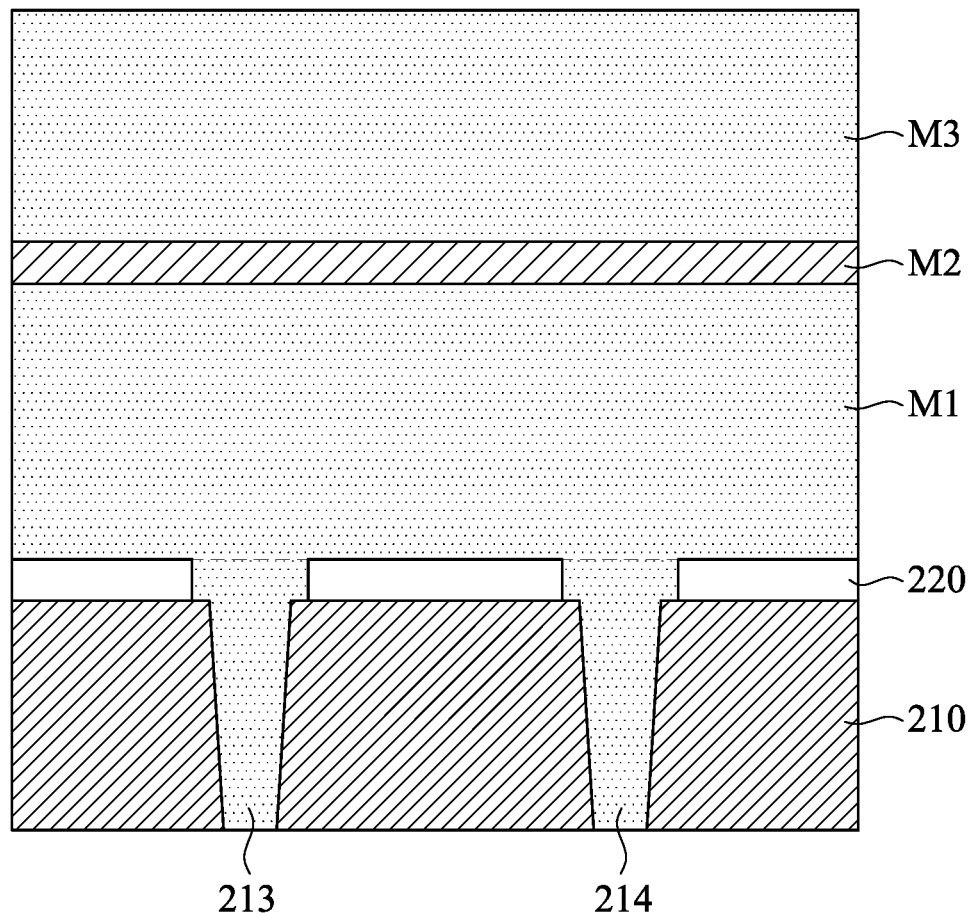

Referring to FIG. 2B, conductive vias 213 and 214 are formed in the openings 211, 212, 221 and 222. The material of the conductive vias 213 and 214 includes Al, Cu, Co, W, ruthenium (Ru), or zirconium (Zr). Referring to FIG. 2B and FIG. 2C, in some embodiments, a first metal layer M1 is formed on the conductive vias 213 and 214. The first metal layer M1 is in contact with the conductive vias 213 and 214. The material of the first metal layer M1 may be different from or identical to that of the conductive vias 213 and 214.

In some embodiments, FIG. 2B may be omitted. Referring to FIG. 2A and FIG. 2C, after the dielectric layer 210 and the etch stop 220 are provided, the first metal layer M1, a second metal layer M2, and a third metal layer M3 are sequentially formed over the etch stop layer 220. In other words, the conductive vias 213, 214 and the first metal layer M1 may be a continuous, seamless body of material. Note that in FIG. 2C to FIG. 2K, the substrate 202 is not shown for simplification.

The material of the first metal layer M1 includes Al, Cu, Co, W, ruthenium (Ru), or zirconium (Zr). In some embodiments, the thickness of the first metal layer M1 is in a range substantially from 20 Å to 700 Å. The material of the second metal layer M2 includes tantalum (Ta), tantalum nitride (TaN), titanium nitride (TiN), Cu, Co, W, Ru, Zr or graphene. In some embodiments, the thickness of the second metal layer M2 is in a range substantially from 5 Å to 200 Å. The material of the third metal layer M3 includes Al, Cu, Co, W, Ru, or Zr. In some embodiments, the thickness of the third metal layer M3 is in a range substantially from 50 Å to 1000 Å. The metal layers M1 to M3 are formed by performing plasma enhanced chemical vapor deposition (CVD) processes, low pressure CVD processes, atomic layer deposition (ALD) processes, or other applicable processes. The first metal layer M1 and the third metal layer M3 may be formed with a temperature ranging from 70 to 400° C. The second metal layer M2 may be formed with a temperature ranging from 80 to 400° C. In some embodiments, the material of the first metal layer M1 is different from that of the second metal layer M2. In addition, the material of the second metal layer M2 is different from that of the third metal layer M3. For example, the material of the first metal layer M1 may include Ru or one of Cu and Co, and the material of the third metal layer M3 may include the other one of Cu and Co. The material of the second metal layer M2 may include Ta, TaN or TiN. In some embodiments, the material of the first metal layer M1 is identical to that of the third metal layer M3. In some embodiments, the material of the first metal layer M1 is different from that of the third metal layer M3.

In the following stages, one or more etch operation is performed to etch the first metal layer M1, the second metal layer M2, and the third metal layer M3, so as to form a metal line corresponding to the first metal layer M1, an intermediate metal layer corresponding to the second metal layer M2, and a metal pillar corresponding to the third metal layer M3.

Figure 2D:
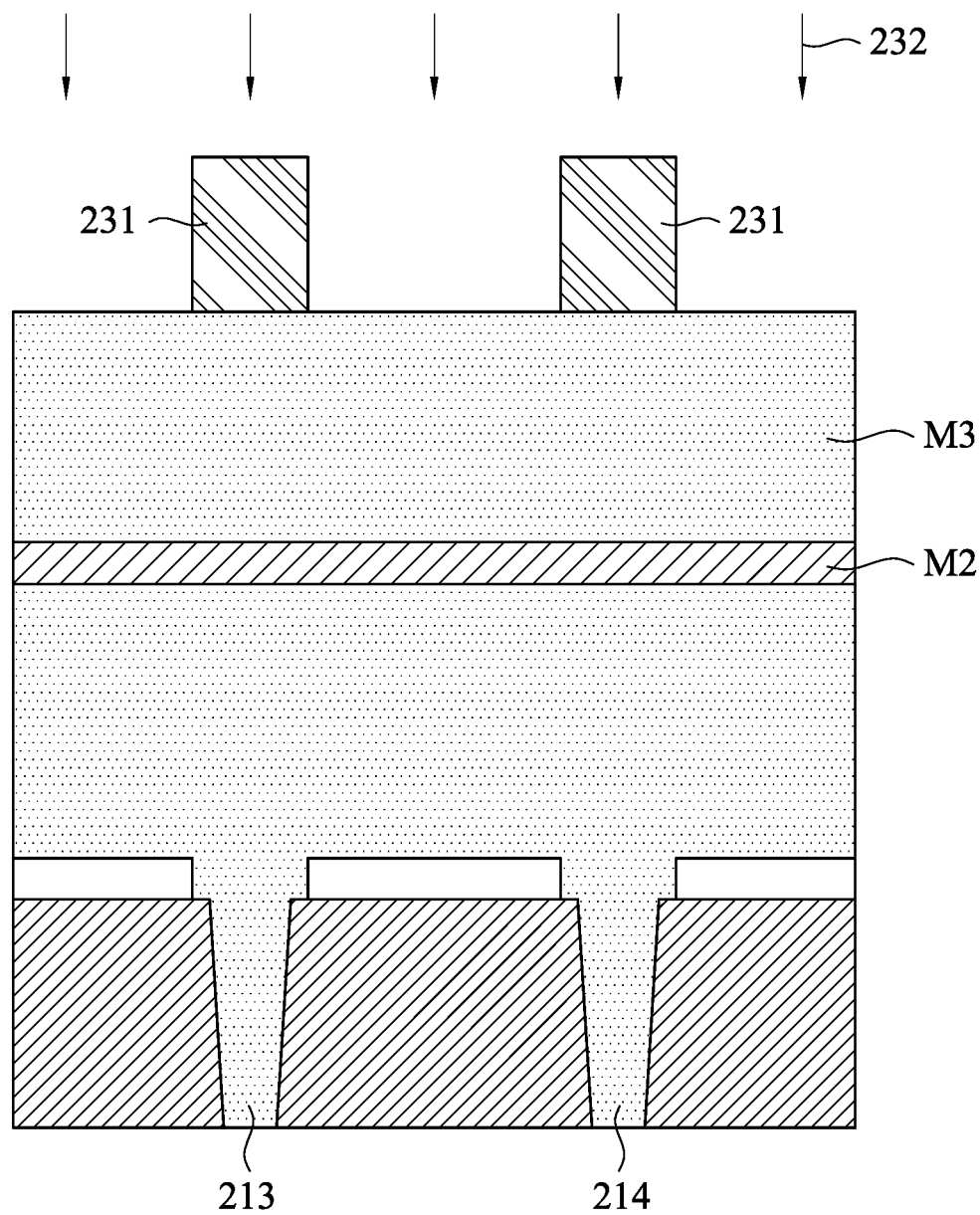
Figure 2E:
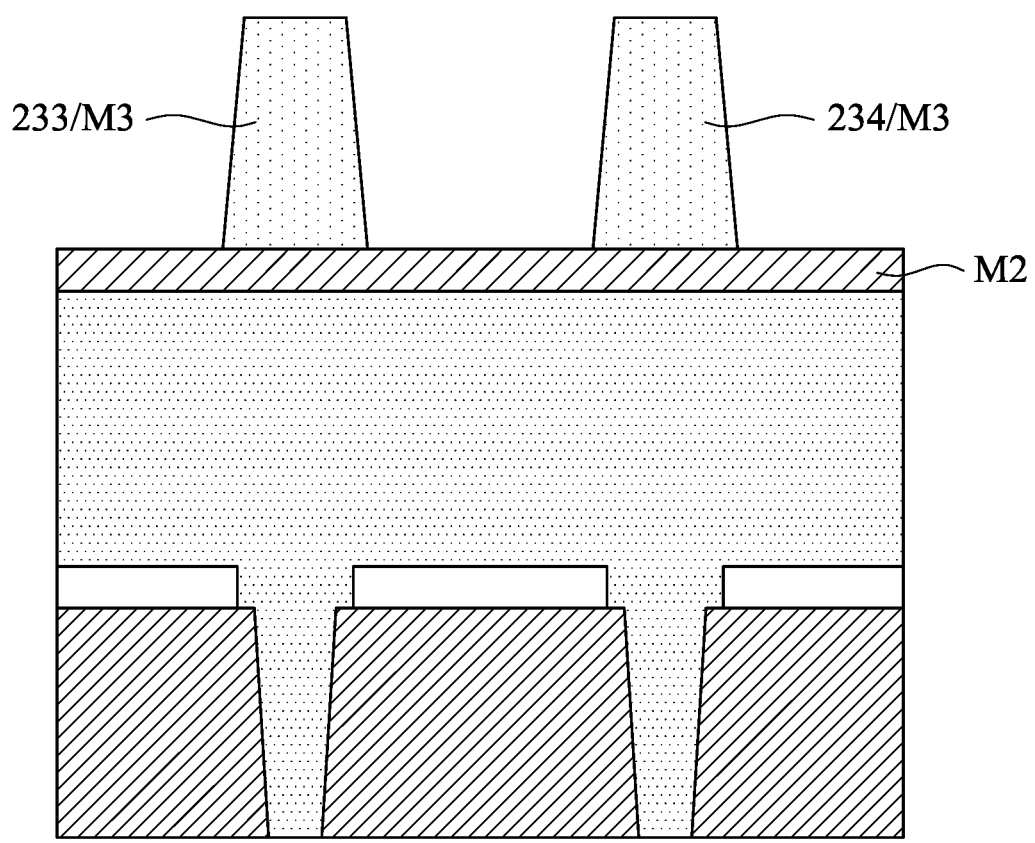

To be specific, referring to FIG. 2D, a first lithography operation is performed to form a patterned photoresist 231 on the third metal layer M3. The photoresist 231 is overlapped with at least a portion of the conductive vias 213 and 214 when viewed from a normal vector of a top surface of the third metal layer M3. A first etch operation 232 is performed to etch the third metal layer M3, so as to expose the second metal layer M2. In the case that the material of the second metal layer M2 is different from that of the third metal layer M3, the second metal layer M2 serves as an etch stop layer. In some embodiments, the etch operation 232 is an ion beam etching (IBE) with etch gases of He, Ne, Ar, Kr or Xe; with etch angle of 0 to 70 degrees; and with power of 50 to 3000 watts. In some embodiments, the etch operation 232 is an RIE etching (using ICP or CCP source) with etch gases of $CH_3OG$, $C_2H_5OH$, $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, etc.; with pressure of 0.5 to 100 mT; with temperature of 15 to 120° C.; and with power of 150 to 3000 watts and bias of 0 to 2000 volts. Referring to FIGS. 2D and 2E, metal pillars 233 and 234 are formed after the etch operation 232 is formed.

Figure 2F:
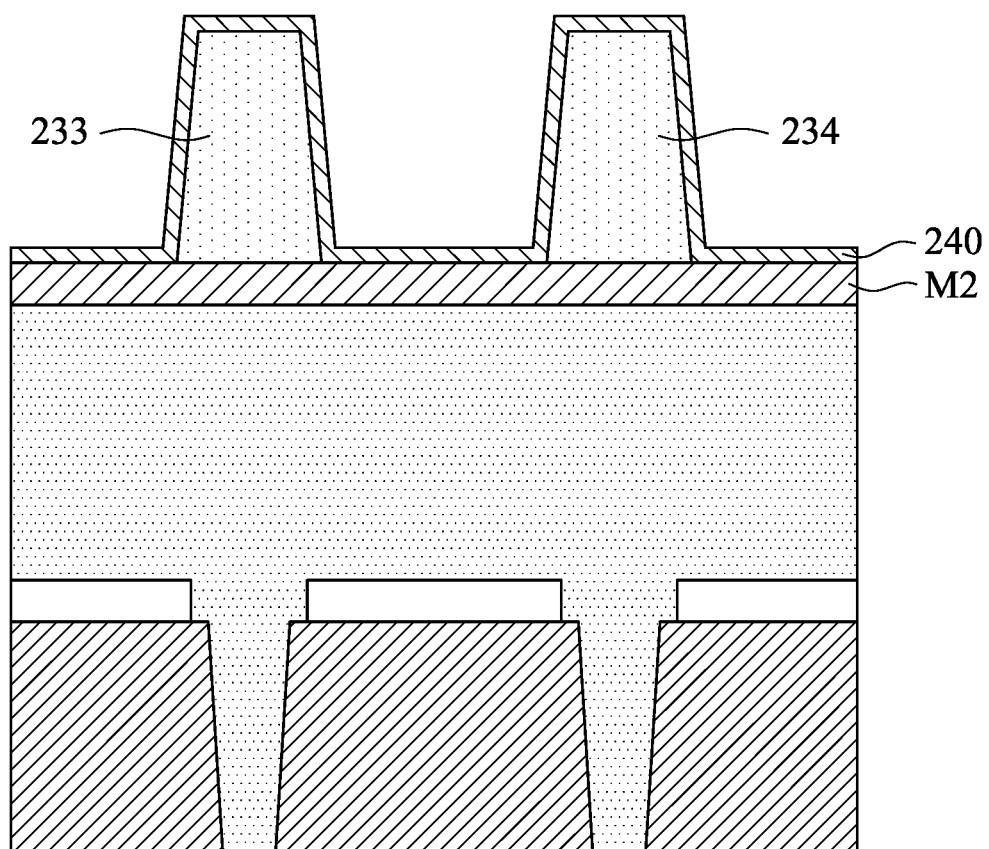

Referring to FIG. 2F, a cap layer 240 is formed that lines a top surface of the second metal layer M2. The cap layer 240 also lines sidewalls and top surfaces of the metal pillars 233 and 234. The material of the cap layer 240 includes Ta, TaN, TiN, Co, Ru, Zr, or graphene. In some embodiments, the material of the cap layer 240 is identical to that of the second metal layer M2. The cap layer 240 is formed by a performing plasma enhanced chemical vapor deposition (CVD) process, a low pressure CVD process, an atomic layer deposition (ALD) process, or other applicable processes. In some embodiments, the thickness of the cap layer 240 is in a range substantially from 10 Å to 100 Å.

Figure 2G:
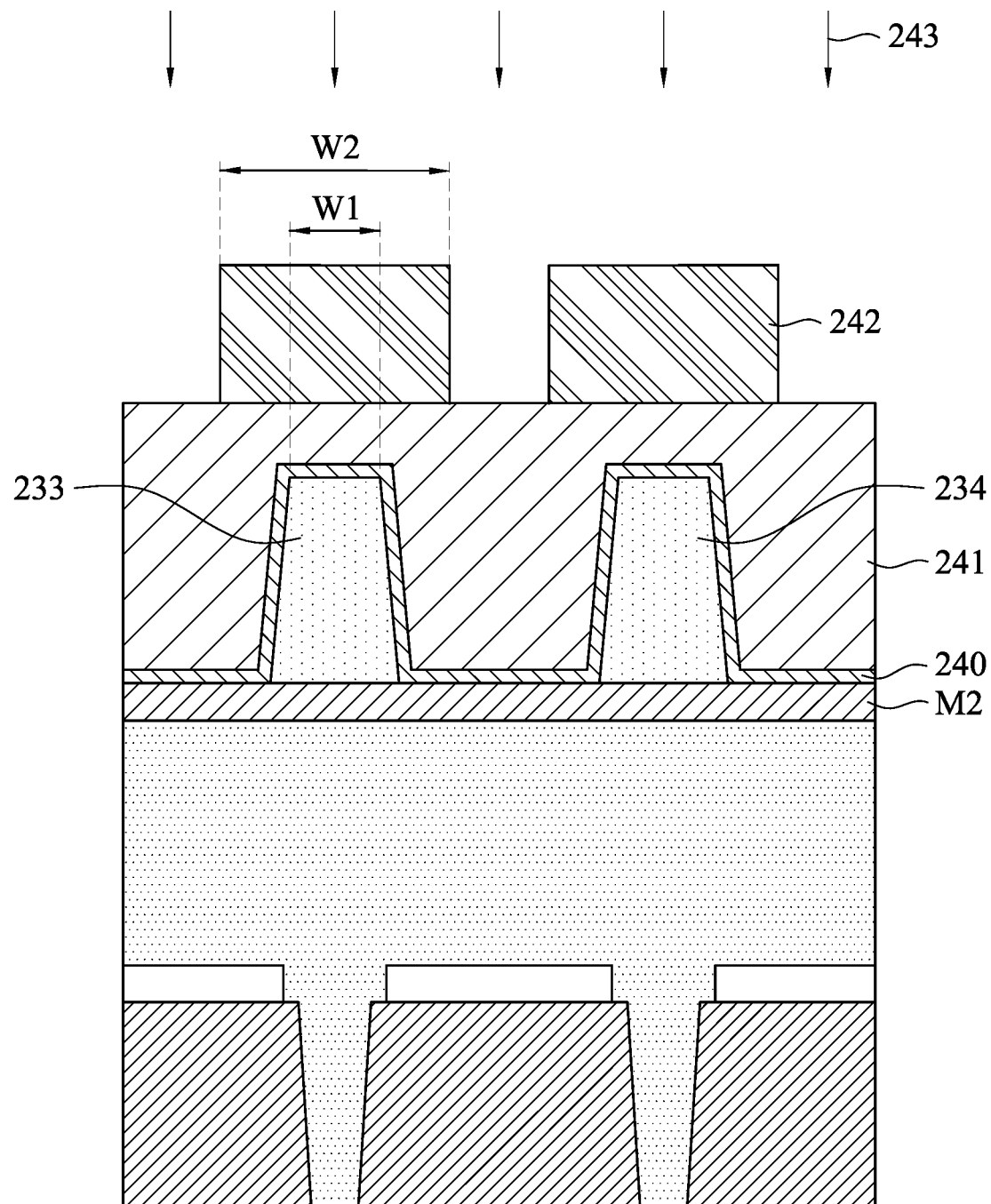
Figure 2H:
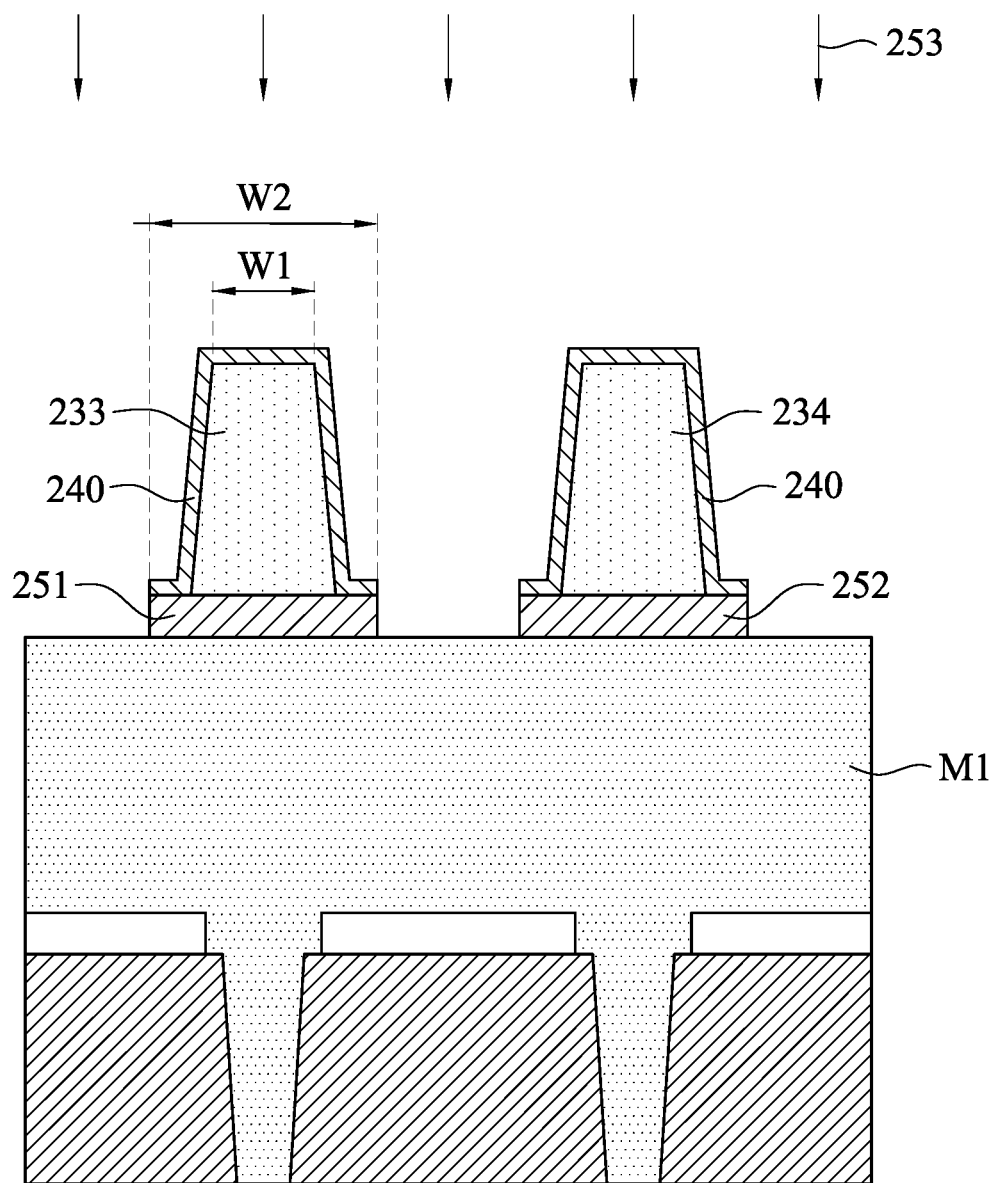

Referring to FIG. 2G, a second lithography operation is performed to form a second photoresist 241 on the cap layer 240 and a third photoresist 242 on the second photoresist 241. The third photoresist 242 is patterned to cover the metal pillars 233 and 234. For example, the metal pillar 233 has a width W1, and the third photoresist 242 has a width W2 greater than the width W1. Next, a second etch operation 243 is performed to etch the cap layer 240 and the second metal layer M2. In some embodiments, the etch operation 243 is an ion beam etching (IBE) with etch gases of He, Ne, Ar, Kr or Xe; with etch angle of 0 to 70 degrees; and with power of 50 to 3000 watts. In some embodiments, the etch operation 243 is an RIE etching (using ICP or CCP source) with etch gases of $CH_3OG$, $C_2H_5OH$, $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, etc.; with pressure of 0.5 to 100 mT; with temperature of 15 to 120° C.; and with power of 150 to 3000 watts and bias of 0 to 2000 volts.

After the etch operation 243 is performed, the photoresists 241 and 242 are removed. Then, referring to FIG. 2H, the first metal layer M1 is exposed, and intermediate metal layers 251 and 252 are formed beneath the metal pillars 233 and 234 respectively. In some embodiments, the intermediate metal layers 251 and 252 have the same width W2 which is greater than the width W1 of the metal pillar 233.

Next, a third etching operation 253 is performed to etch the first metal layer M1. In some embodiments, the material of the cap layer 240 is different from that of the first metal layer M1. The cap layer 240 serves as a mask so that the metal pillars 233 and 234 are not damaged. In some embodiments, the etch operation 253 is an ion beam etching (IBE) with etch gases of He, Ne, Ar, Kr or Xe; with etch angle of 0 to 70 degrees; and with power of 50 to 3000 watts. In some embodiments, the etch operation 253 is an RIE etching (using ICP or CCP source) with etch gases of $CH_3OG$, $C_2H_5OH$, $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, etc.; with pressure of 0.5 to 100 mT; with temperature of 15 to 120° C.; and with power of 150 to 3000 watts and bias of 0 to 2000 volts.

Figure 2I:
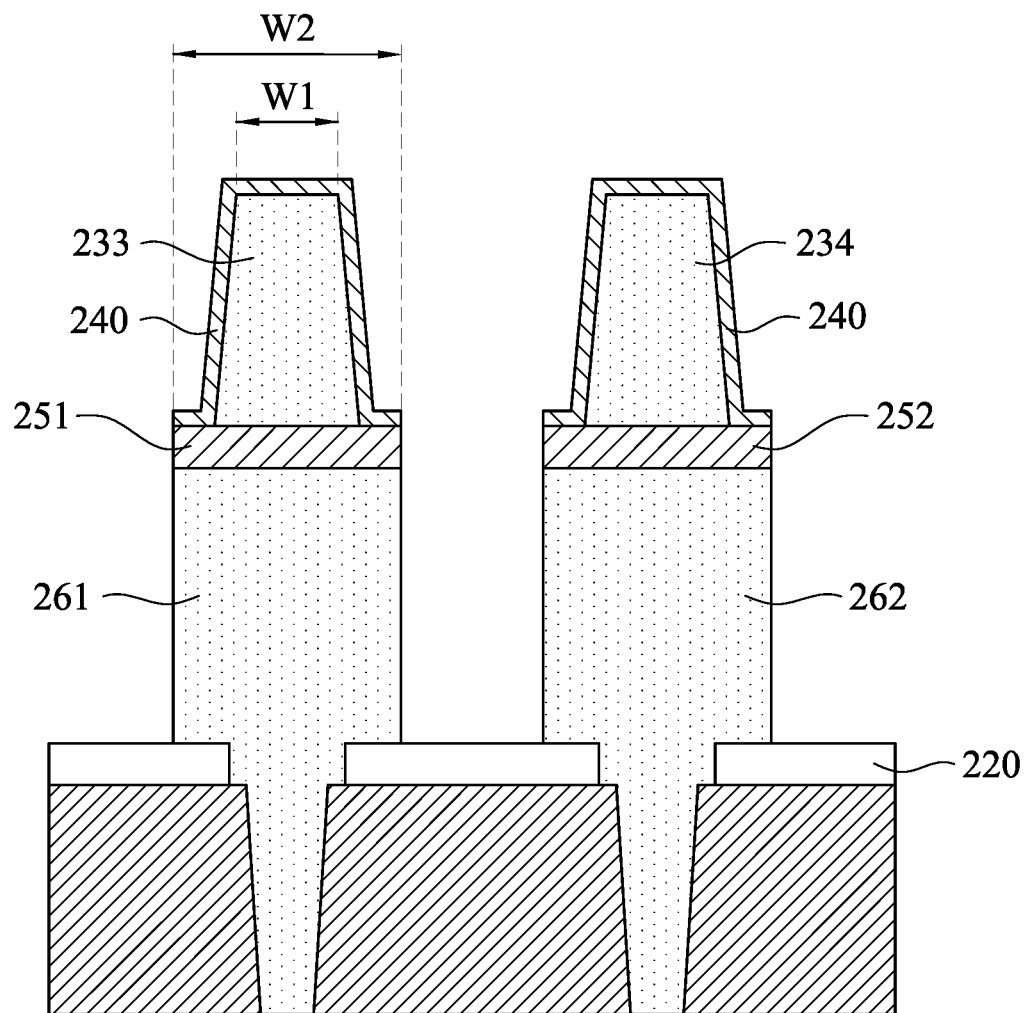

After the etch operation 253 is performed, referring to FIG. 2I, the etch stop layer 220 is exposed. In addition, metal lines 261 and 262 are formed beneath the intermediate metal layers 251 and 252 respectively. In some embodiments, the sidewalls of the metal lines 261 are vertically aligned with the sidewalls of the intermediate metal layer 251. Similarly, the sidewalls of the metal lines 262 are vertically aligned with the sidewalls of the intermediate metal layer 252. Note that the width W2 of the metal line 261 is greater than the width W1 of the metal pillar 233 because the metal pillar 233 and the metal line 261 are formed from top to bottom (instead of from bottom to top in the conventional art). The resistance of the metal line 261 may be reduced due to the greater width. In addition, the metal pillar 233 and the metal line 261 do not have voids because they are not formed by filling a trench with a metal layer.

Figure 2J:
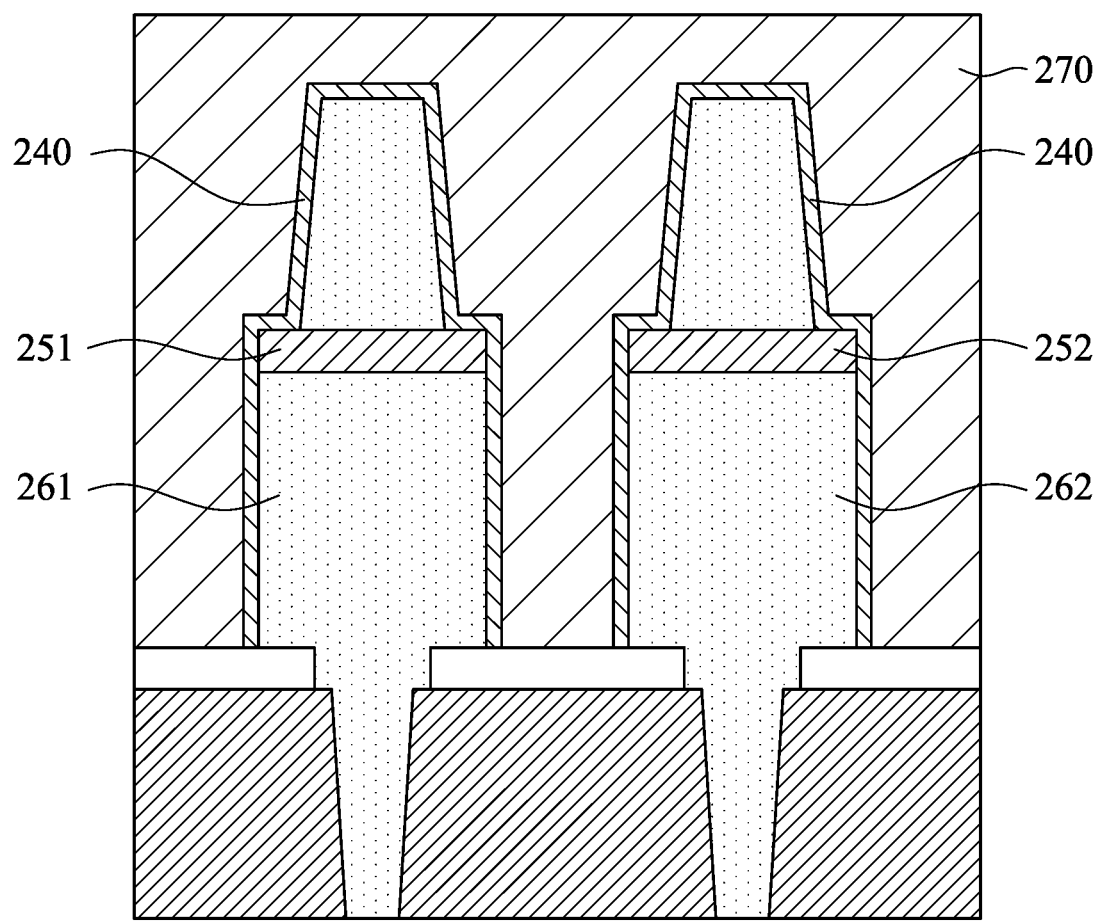

Referring to FIG. 2J, in some embodiments, the cap layer 240 is re-deposited. The cap layer 240 selectively grows on the original cap layer 240 and on the sidewalls of the intermediate metal layers 251 and 251, and on the sidewalls of the metal lines 261 and 262.

A dielectric layer 270 is formed on the cap layer 240. In some embodiments, the dielectric layer 270 is an interlayer dielectric layer or an intermetal dielectric layer. The dielectric layer 270 may include multilayers made of multiple dielectric materials, such as a low dielectric constant or an extreme low dielectric constant (ELK) material. In some embodiments, the dielectric layer 270 is made of low-k dielectric materials. In some embodiments, the dielectric layer 270 is made of silicon oxide, silicon nitride, silicon oxynitride, phosphosilicate glass (PSG), borophosphosilicate glass (BPSG), and/or other applicable low-k dielectric materials.

Figure 2K:
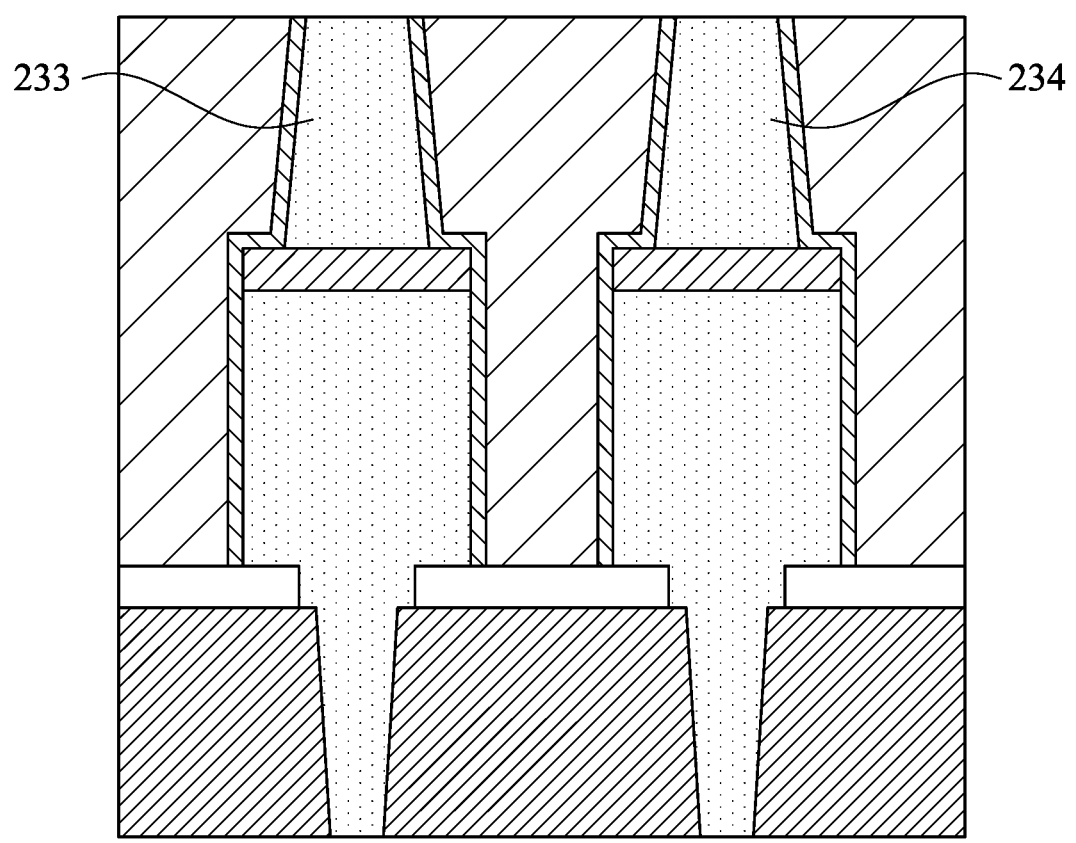

Referring to FIG. 2K, in some embodiments, a chemical-mechanical polishing (CMP) process is applied to remove an excess portion of the dielectric layer 270. An etch operation may be performed to etch the cap layer 240, so as to expose the metal pillars 233 and 234. Other conductive features may be formed to be in contact with the metal pillars 233 and 234.

In accordance with some embodiments, an interconnect structure includes a first dielectric layer, an etch stop layer, a conductive via, a conductive line, an intermediate conductive layer, a conductive pillar, and a second dielectric layer. The etch stop layer is over the first dielectric layer. The conductive via is in the first dielectric layer and the etch stop layer. The conductive line is over the conductive via. The intermediate conductive layer is over the conductive line. The conductive pillar is over the intermediate conductive layer. The second dielectric layer surrounds the conductive line, the intermediate conductive layer, and the conductive pillar, and a bottom of the second dielectric layer is lower than a top of the conductive line, and a top of the second dielectric layer is higher than the top of the conductive line.

In accordance with some embodiments, an interconnect structure includes a dielectric layer, an etch stop layer over the dielectric layer, a conductive line over the etch stop layer, an intermediate conductive layer over the conductive line, a conductive pillar over the intermediate conductive layer, and a cap layer. A portion of a top surface of the intermediate conductive layer is free from coverage by the conductive pillar. The cap layer extends along sidewalls of the conductive pillar, said portion of the top surface of the intermediate conductive layer that is free from coverage by the conductive pillar, and sidewalls of the intermediate conductive layer and the conductive line.

In accordance with some embodiments, an interconnect structure includes a first dielectric layer, an etch stop layer over the first dielectric layer, a conductive via, a conductive line over the conductive via, an intermediate conductive layer over the conductive line, a conductive pillar, and a second dielectric layer. The conductive via is in the first dielectric layer and the etch stop layer and tapers downwards. The conductive pillar is over the intermediate conductive layer and tapers upwards. The second dielectric layer surrounds the conductive line, the intermediate conductive layer, and the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first dielectric layer;
   an etch stop layer over the first dielectric layer;
   an interconnect structure, comprising:
      a conductive via in the first dielectric layer and the etch stop layer;
      a conductive line over the conductive via;
      an intermediate conductive layer over the conductive line; and
      a conductive pillar over the intermediate conductive layer, wherein the interconnect structure is electrically conductive at least from a top of the conductive pillar to a bottom of the conductive via; and
   a second dielectric layer surrounding the conductive line, the intermediate conductive layer, and the conductive pillar, wherein a bottom of the second dielectric layer is lower than a top of the conductive line, and a top of the second dielectric layer is higher than the top of the conductive line.

2. The device of claim 1, wherein the intermediate conductive layer is in contact with the conductive pillar and the conductive line.

3. The device of claim 1, wherein the intermediate conductive layer is thinner than the conductive line and the conductive pillar.

4. The device e of claim 1, wherein the top of the second dielectric layer is higher than a top of the intermediate conductive layer.

5. The device of claim 1, wherein the top of the second dielectric layer is higher than a bottom of the intermediate conductive layer.

6. The device of claim 1, further comprising:
a cap layer surrounding the conductive line, the intermediate conductive layer, and the conductive pillar.

7. The device of claim 6, wherein the cap layer is between the second dielectric layer and the interconnect structure.

8. The device of claim 6, wherein the cap layer is in contact with the second dielectric layer, the conductive line, the intermediate conductive layer, and the conductive pillar.

9. The device of claim 6, wherein a top of the cap layer is higher than a top of the intermediate conductive layer.

10. The device of claim 6, wherein a top of the cap layer is substantially aligned laterally with the top of the second dielectric layer and the top of the conductive pillar.

11. A device, comprising:
a dielectric layer;
a conductive line in the dielectric layer;
an intermediate conductive layer in the dielectric layer and over the conductive line;
a conductive pillar in the dielectric layer and over the intermediate conductive layer, wherein a top surface of the intermediate conductive layer has a first portion covered by the conductive pillar and a second portion free from coverage by the conductive pillar; and
a cap layer in the dielectric layer and extending along sidewalls of the conductive pillar, the second portion of the top surface of the intermediate conductive layer, and sidewalls of the intermediate conductive layer and the conductive line, wherein the dielectric layer has a portion that is lower than a top surface of the conductive pillar and vertically overlaps the second portion of the top surface of the intermediate conductive layer.

12. The device of claim 11, wherein the first portion of the top surface of the intermediate conductive layer is in contact with the conductive pillar.

13. The device of claim 11, wherein an obtuse angle is between at least one of the sidewalls of the conductive pillar and the second portion of the top surface of the intermediate conductive layer.

14. The device of claim 11, wherein the conductive line and the intermediate conductive layer comprise different materials.

15. The device of claim 11, wherein the conductive line and the conductive pillar comprise the same material.

16. A device, comprising:
a first dielectric layer;
an etch stop layer over the first dielectric layer;
a second dielectric layer over the etch stop layer;
a conductive via in the first dielectric layer and the etch stop layer;
a conductive line in the second dielectric layer and over the conductive via;
an intermediate conductive layer in the second dielectric layer and over the conductive line;
a conductive pillar in the second dielectric layer and over and in contact with the intermediate conductive layer, wherein the conductive pillar is defined by a single piece of material that is continuous throughout, and the intermediate conductive layer extends beyond an entire width of the conductive pillar; and
a cap layer between the second dielectric layer and a combination of the conductive pillar, the intermediate conductive layer, and the conductive line, wherein a top of the cap layer is substantially aligned laterally with a top of the conductive pillar.

17. The device of claim 16, wherein the top of the cap layer is substantially aligned laterally with a top of the second dielectric layer.

18. The device of claim 16, wherein the conductive pillar and the conductive via taper in opposite directions.

19. The device of claim 16, wherein the conductive line is defined by a single piece of material that is continuous throughout.

20. The device of claim 16, wherein the intermediate conductive layer and the conductive pillar comprise different materials.

* * * * *